(12) United States Patent
Nakatani et al.

(10) Patent No.: US 7,038,310 B1
(45) Date of Patent: May 2, 2006

(54) POWER MODULE WITH IMPROVED HEAT DISSIPATION

(75) Inventors: Seiichi Nakatani, Osaka (JP); Koichi Hirano, Osaka (JP); Mitsuhiro Matsuo, Osaka (JP); Hiroyuki Handa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 122 days.

(21) Appl. No.: 09/587,768

(22) Filed: Jun. 6, 2000

(30) Foreign Application Priority Data

Jun. 9, 1999 (JP) ................................. 11-162541

(51) Int. Cl.
*H01L 23/10* (2006.01)
*H01L 23/34* (2006.01)

(52) U.S. Cl. .................. 257/706; 257/778; 257/690

(58) Field of Classification Search ................ 257/690, 257/706, 778, 796
See application file for complete search history.

(56) References Cited

U.S. PATENT DOCUMENTS

| | | | | |
|---|---|---|---|---|
| 3,922,712 A | * | 11/1975 | Stryker ...................... 257/737 |
| 5,625,226 A | * | 4/1997 | Kinzer ........................ 257/705 |
| 5,627,107 A | * | 5/1997 | Howard .................. 264/272.17 |
| 5,703,399 A | * | 12/1997 | Majumdar et al. ........... 257/723 |
| 5,781,412 A | * | 7/1998 | de Sorgo ..................... 361/704 |
| 5,920,117 A | * | 7/1999 | Sono et al. .................. 257/675 |
| 6,038,133 A | * | 3/2000 | Nakatani et al. ............. 361/760 |
| 6,060,150 A | | 5/2000 | Nakatani et al. |
| 6,255,742 B1 | * | 7/2001 | Inaba .......................... 257/796 |
| 6,784,541 B1 | * | 8/2004 | Eguchi et al. .............. 257/796 |

FOREIGN PATENT DOCUMENTS

JP 10 173097 6/1998

* cited by examiner

*Primary Examiner*—Howard Weiss
(74) *Attorney, Agent, or Firm*—Hamre, Schumann, Mueller & Larson, P.C.

(57) ABSTRACT

The invention provides a power module that is excellent in heat dissipation and suitable for the trend of miniaturization with high density, and provides also a method of manufacturing the same. The power module includes an insulating layer including an inorganic filler and a thermosetting resin composition, a lead formed on the surface of the insulating layer, and a semiconductor chip mounted on a insulating layer side of the lead, and a heat sink formed on the backside of the insulating layer. The semiconductor chip is mounted on the lead by flip-chip bonding and sealed in the insulating layer.

21 Claims, 5 Drawing Sheets

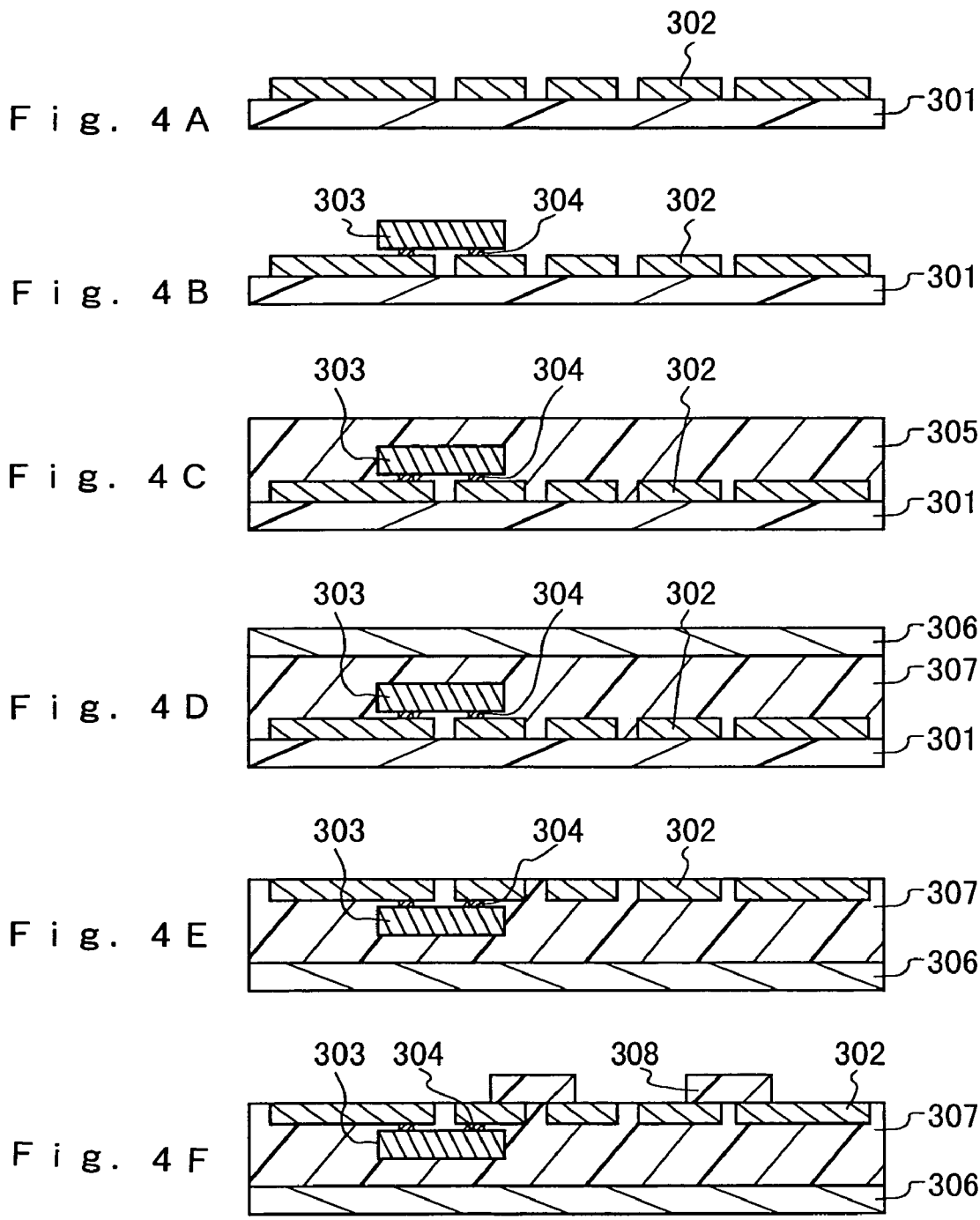

POWER MODULE WITH IMPROVED HEAT DISSIPATION

BACKGROUND OF THE INVENTION

1. Field of the Invention

The present invention relates to a power module with a mounted semiconductor chip, and a method of manufacturing the same.

2. Description of the Prior Art

Recently, with a demand for high performance and miniaturization of electronic equipment, smaller power source circuits consuming less power have been increasingly desired in the power electronics field. The heat dissipating structure of a power module is a key issue for the purposes.

In a method proposed to improve heat dissipation of a power module, a substrate with high thermal conductivity is used. A semiconductor chip is mounted on this substrate so that the backside (the side opposite to the device-forming surface) of the semiconductor chip contacts with the surface of the substrate, and heat is dissipated from the substrate.

To achieve this purpose, for example, a method using a metal-base substrate has been proposed. The metal-base substrate has a metal sheet such as aluminum, an insulating layer formed on the metal sheet, and a wiring pattern formed on the insulating layer. Another method employs a substrate prepared by joining a copper sheet to a surface of a ceramic sheet such as aluminum oxide and aluminum nitride.

In another proposed method, a lead is formed on a surface of a substrate prepared by dispersing an inorganic filler in a thermoplastic resin, and a semiconductor chip is mounted thereon. However, since this substrate is produced by melt-kneading a thermoplastic resin and an inorganic filler and injecting this mixture, the inorganic filler is difficult to fill with high density. As a result, the thermal conductivity cannot be improved remarkably.

In a method disclosed in JP-A-10-173097, a lead is formed on a surface of a substrate prepared by dispersing an inorganic filler in a thermosetting resin composition and a semiconductor chip is mounted thereon. This substrate is produced by laminating a sheet and a lead frame and subsequently by curing the sheet. The sheet comprises a thermosetting resin and an inorganic filler, and it is flexible in an uncured state. In this method, the inorganic filler can be filled with high density, and the thermal conductivity is improved.

In the field of signal circuits, flip-chip bonding or wire bonding is used for mounting semiconductor chips. Flip-chip bonding indicates mounting of a semiconductor chip face down so that the substrate surface and the semiconductor chip surface (device-forming surface) face each other. Flip-chip bonding provides mounting with higher density when compared with wire bonding.

However, in the field of power circuits, heat should be dissipated from the backside of a semiconductor chip. Therefore, in a conventional power module to dissipate heat from a semiconductor chip to a substrate, an improvement in heat dissipation cannot be expected when flip-chip bonding is used.

Therefore, wire bonding has been employed for conventional power modules. Wire bonding indicates that a semiconductor chip is borne on a substrate to contact the substrate surface and the backside of the semiconductor chip, and an electrode of the semiconductor chip and the lead formed on the substrate are connected with each other through a metal wire. However, since the conductive resistance of the metal wire is considerably great when compared with ON resistance of the semiconductor element, power loss is increased and so is the calorific value when a semiconductor chip is mounted by wire bonding. As a result, a substrate is required to have more heat dissipation capacity when wire bonding is used.

SUMMARY OF THE INVENTION

To solve the above-mentioned problems, the present invention provides a power module that is excellent in heat dissipation and suitable for miniaturization with higher density, and also the present invention provides a method of manufacturing the power module.

For these purposes, a power module of the present invention comprises an insulating layer comprising an inorganic filler and a thermosetting resin composition, a lead formed on one side of the insulating layer, a heat sink formed on another side of the insulating layer, and at least one semiconductor chip sealed in the insulating layer and electrically connected with the lead by flip-chip bonding.

Such a power module contains a semiconductor chip inside a thermal conductive insulating layer, and the semiconductor chip is arranged with its backside facing the heat sink. As a result, heat can be dissipated efficiently from the backside of the semiconductor chip to the heat sink through the insulating layer. Furthermore, the semiconductor chip can be protected from moisture absorption or the like. Since the semiconductor chip is mounted by flip-chip bonding, the ohmic loss at the wired portions is lowered and mounting with higher density can be carried out when compared with a case of mounting by wire bonding.

It is preferable in the power module that the semiconductor chip has a first electrode facing the lead and a second electrode facing the heat sink, and the first electrode is electrically connected with the lead by flip-chip bonding while the second electrode is electrically connected with the lead through an inner lead arranged in the insulating layer. A large capacity of current can be applied by using a semiconductor chip configured to carry current in the thickness direction.

It is preferable in the power module that the proportion of the inorganic filler in the insulating layer is 70 to 95 wt % and the thermosetting resin composition is 5 to 30 wt %. Accordingly, the thermal conductivity of the insulating layer is good and the heat dissipation can be further improved. Moreover, the coefficient of thermal expansion of the insulating layer can be adjusted to the same level as that of a semiconductor, and the power module will have excellent reliability.

It is preferable in the power module that the thermal conductivity of the insulating layer is 1 to 10 W/(m·K), since the heat dissipation can be further improved.

It is preferable in the power module that the coefficient of thermal expansion of the insulating layer is 8 to $20 \times 10^{-6}$ $K^{-1}$. By adjusting the coefficients of the insulating layer and of the semiconductor chip to be substantially the same, the power module will have excellent reliability against a thermal shock or the like.

It is preferable in the power module that modulus of elasticity of the insulating layer is 20 to 50 MPa, since the power module will have excellent reliability against a thermal shock or the like.

It is preferable in the power module that an electronic component is arranged on the side of the insulating layer where the lead is formed, and electrically connected with the lead, since a smaller power module with higher density can be provided.

It is preferable in the power module that the lead is buried in the insulating layer while a part thereof is exposed to the surface of the insulating layer, since the lead itself contributes to heat dissipation, and thus, the heat dissipation efficiency can be further improved. Another advantage is that an electronic component can be mounted with less dislocation on a surface of the lead that is opposite to the insulating layer side.

It is preferable in the power module that a circuit board prepared by laminating at least one substrate layer and wiring layers is buried in the insulating layer while at least one of the wiring layers is exposed to the surface of the insulating layer. Accordingly, not only a power source circuit but peripheral circuits such as a control circuit and a protection circuit can be integrated, and mounting with higher density can be provided.

It is preferable in the power module that the thermosetting resin composition comprises a thermosetting resin, a hardening agent, and a hardening accelerator.

Preferably in this case, the proportion of the thermosetting resin in the thermosetting resin composition is 50 to 95 wt %, the hardening agent is 4.9 to 45 wt %, and the hardening accelerator is 0.1 to 5 wt %.

It is preferable in the power module that the thermosetting resin composition comprises at least one thermosetting resin selected from the group consisting of an epoxy resin, a phenol resin, and a cyanate resin, since these thermosetting resins are excellent in heat resistance and electric insulation.

It is preferable in the power module that the thermosetting resin composition comprises an epoxy resin, a novolac resin, and imidazole. It is especially preferable that the thermosetting resin composition comprises a brominated polyfunctional epoxy resin, a bisphenol A novolac resin, and imidazole, since these compositions are excellent in heat resistance, electric insulation and incombustibility.

Preferably in this case, the proportion of the epoxy resin in the thermosetting resin composition is 60 to 80 wt %, the novolac resin is 18 to 39.9 wt %, and the imidazole is 0.1 to 2 wt %.

It is preferable in the power module that the inorganic filler is at least one selected from the group consisting of $Al_2O_3$, $SiO_2$, MgO, BN and AlN, since these inorganic fillers are especially effective for improving the thermal conductivity of the insulating layer. Among them, AlN and BN are particularly effective for improving the thermal conductivity and for lowering coefficient in thermal expansion of the insulating layer.

It is preferable in the power module that an average particle diameter of the inorganic filler is from 0.1 to 100 µm, since the inorganic filler can be filled with high density. It should be specifically noted that using a combination of inorganic fillers having average particle diameters varying within the above-identified range can provide a filling with higher density, and thus, the thermal conductivity can be further improved.

It is preferable in the power module that the lead is made of at least one metal selected from the group consisting of copper, aluminum, nickel and iron, since the electric conductivity is high and thus ohmic loss is reduced even if large current flows. Among them, copper is especially effective to improve heat dissipation, since it has excellent electric conductivity and also good thermal conductivity.

It is preferable in the power module that the lead is 0.05 to 1.00 mm in thickness, since it can handle a relatively large current.

It is preferable in the power module that a plating layer of at least one metal selected from the group consisting of nickel, tin, solder and gold is formed on the surface of the lead which is in contact with the insulating layer, since the lead is well bonded to the insulating layer, and reliability against a thermal shock or the like will be improved.

It is preferable in the power module that the surface of the lead which is in contact with the insulating layer is roughened, since the lead is well bonded to the insulating layer, and reliability against thermal shock or the like will be improved.

It is preferable in the power module that the heat sink is made of either aluminum or copper, since these metals are excellent in thermal conductivity. Among them, copper can provide good heat dissipation due to its excellent thermal conductivity. Aluminum is lightweight and available at a low cost. Moreover, it has good processability, so an aluminum heat sink can have a complicated shape to increase its surface area, so that good heat dissipation can be obtained.

It is preferable in the power module that the heat sink comprises a heat dissipating fin, since the heat dissipation efficiency is further improved.

It is preferable in the power module that the surface of the heat sink which is in contact with the insulating layer is roughened, since the heat sink will be well bonded to the insulating layer, and reliability against heat shock or the like can be improved.

The semiconductor chip used here can be, for example, a chip of a silicon semiconductor, a silicon carbide semiconductor or the like. More specifically, an insulated gate-bipolar transistor (IGBT), a metal oxide semiconductor-field effect transistor (MOS-FET) or the like can be used.

For the above-noted purposes, a method of manufacturing a power module of the present invention comprises:

forming a lead on a release carrier;

mounting a semiconductor chip on the lead by flip-chip bonding;

forming on the release carrier an uncured insulating layer comprising an inorganic filler and a thermosetting resin composition to cover the lead and the semiconductor chip;

laminating a heat sink on the uncured insulating layer to form a laminate;

heating the laminate to cure the insulating layer; and peeling the release carrier.

Accordingly, a power module of the present invention can be manufactured efficiently. Moreover, since leads are formed on release carriers in the method, fine and independent wiring patterns can be formed and thus, smaller modules are obtainable.

It is preferable in the method that the proportion of the inorganic filler in the insulating layer is 70 to 90 wt % and the thermosetting resin composition is 5 to 30 wt %, since the thermal conductivity of the insulating layer can be improved and the heat dissipation of the power module can be further improved.

It is preferable in the method that the insulating layer is formed by applying a paste comprising the inorganic filler and the thermosetting resin composition on the release carrier, since the inorganic filler can be filled with high density in the insulating layer, and thus, heat dissipation of the power module can be further improved.

In this case, it is preferable that the paste is applied by either screen printing or metal mask printing, since the insulating layer can be formed using simple facilities.

It is preferable in the method that the insulating layer is formed by laminating a sheet comprising the inorganic filler and the thermosetting resin composition on the release carrier, in which the sheet is flexible in an uncured state, since the inorganic filler can be filled with high density in the insulating layer, and thus, heat dissipation of the power module can be further improved.

It is preferable in the method that an element formed on the release carrier is exposed to a vacuum either while the insulating layer is formed or before the formed insulating layer is cured, since voids in the insulating layer, which will lower the breakdown voltage, can be decreased.

It is preferable in the method that after peeling the release carrier, an electronic component is mounted on the lead, since a smaller power module with higher density can be provided.

It is preferable in the method that a circuit board as a laminate of wiring layers and at least one substrate layer is arranged on the release carrier after formation of the lead on the release carrier, and the insulating layer is formed to cover the circuit board, since a smaller power module with higher density can be provided by forming peripheral circuits such as a control circuit and a protection circuit on the circuit board.

It is preferable in the method that the laminate is heated at a temperature ranging from 130 to 260° C., since the thermosetting resin composition constituting the insulating layer can be cured in a short period.

It is preferable in the method that a pressure of not more than 19.6 MPa is applied to the laminate when heating, since the thermosetting resin composition constituting the insulating layer can be filled easily in the gap provided between the semiconductor chip and the lead.

It is preferable in the method that the thermosetting resin composition comprises a thermosetting resin, a hardening agent, and a hardening accelerator. Preferably in this case, the proportion of the thermosetting resin in the thermosetting resin composition is 50 to 95 wt %, the hardening agent is 4.9 to 45 wt %, and the hardening accelerator is 0.1 to 5 wt %.

It is preferable in the method that the thermosetting resin composition comprises at least one thermosetting resin selected from the group consisting of an epoxy resin, a phenol resin, and a cyanate resin, since such resins have excellent heat resistance and electric insulation.

It is preferable in the method that the thermosetting resin composition comprises a thermosetting resin that is liquid at room temperature, since a paste having a proper viscosity to be applied or a sheet having a proper flexibility can be produced easily. Here, room temperature usually means 20° C.

Preferably in this case, the thermosetting resin that is liquid at room temperature is at least one resin selected from the group consisting of bisphenol A epoxy resin, bisphenol F epoxy resin and liquid phenol resin, since the insulating layer will have excellent heat resistance, and the insulating layer easily can be filled in the gap between the flip-chip bonded semiconductor chip and the lead.

It is preferable in the method that the inorganic filler is at least one selected from the group consisting of $Al_2O_3$, $SiO_2$, MgO, BN and AlN, since such fillers are especially effective for improving thermal conductivity of the insulating layer.

It is preferable in the method that an average particle diameter of the inorganic filler is from 0.1 to 100 μm, since the inorganic filler can be filled with high density.

It is preferable in the method that the lead is made of at least one metal selected from the group consisting of copper, aluminum, nickel and iron, since the high electrical conductivity of the metals serves to reduce ohmic loss.

It is preferable in the method that the lead is 0.05 to 1.00 mm in thickness, since it can handle a relatively large current.

It is preferable in the method that before forming the insulating layer, a plating layer of at least one metal selected from the group consisting of nickel, tin, solder and gold is formed on a surface of the lead to contact with the insulating layer, since the strength to bond to the insulating layer can be improved, and solder wetting at mounting of semiconductor chips and of electronic components can be improved.

It is preferable in the method that a surface of the lead to contact with the insulating layer is roughened before forming the insulating layer, since strength to bond to the insulating layer can be improved.

It is preferable in the method that the heat sink is made of either aluminum or copper. It is further preferable that the heat sink comprises a heat dissipating fin, since heat dissipation efficiency is improved.

It is preferable in the method that a surface of the heat sink to contact with the insulating layer is roughened before the heat sink is laminated on the insulating layer, since strength to bond to the insulating layer is improved.

It is preferable in the method that the release carrier is an organic film, since such an organic film can be peeled easily from the insulating layer or from the lead, and the film can be produced at a low cost. The organic film can comprise, for example, at least one material selected from the group consisting of polyphenylene oxide, polyimide, polyethylene, polyethylene terephthalate and aramid.

It is preferable in the method that the release carrier is a metal foil, since metal foils are less changed in dimension by heat and the amount of dimensional change can be decreased in the step of curing the insulating layer. The metal foil may be at least one selected from the group consisting of, for example, a copper foil, a nickel foil and an aluminum foil.

BRIEF DESCRIPTION OF THE DRAWINGS

FIGS. 4A–4F are cross sectional views to show process steps to manufacture a power module of the present invention.

DETAILED DESCRIPTION OF THE PREFERRED EMBODIMENT

Figure 1:
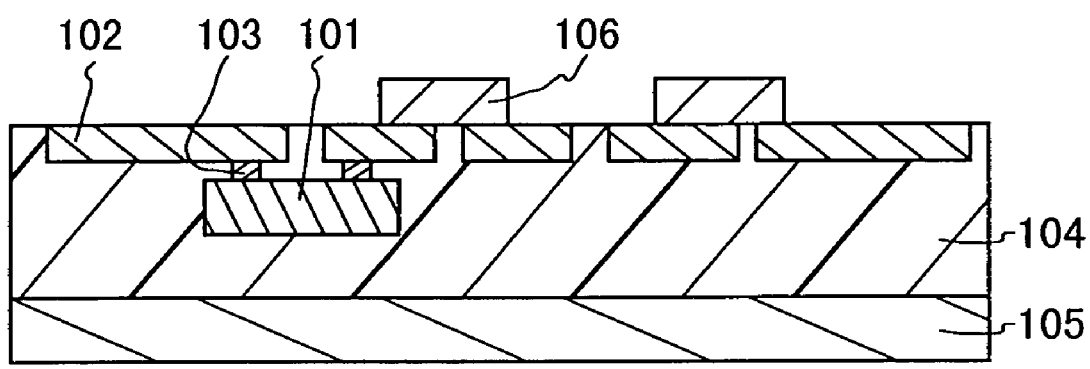
FIG. 1 is a cross-sectional view to show an example of power modules of the present invention.

FIG. 1 is a cross-sectional view to show a power module of the present invention. This power module comprises an insulating layer 104, a semiconductor chip 101 arranged in the insulating layer 104, a lead frame 102 formed on the first side of the insulating layer 104, and a heat sink 105 formed on the second side of the insulating layer 104. The semiconductor chip 101 has a surface electrode thereon. The semiconductor chip 101 is electrically connected with the lead frame 102 by flip-chip bonding. More specifically, the semiconductor chip 101 is arranged with its face (device-forming side) facing the lead frame and its back (the side opposite to the device-forming side) facing the heat sink. The surface electrode of the semiconductor chip 101 and the lead frame 102 are connected with each other through a bump 103. A surface mounted electronic component 106 is arranged on the first side of the insulating layer 104, and it is electrically connected with the lead frame 102.

In the power module, an insulating material constituting the insulating layer 104 covers from the back the semiconductor chip 101 mounted on the lead frame 102, and the insulating material is filled also in the gap between the semiconductor chip 101 and the lead frame 102. As a result, the semiconductor chip 101 is buried in the insulating layer 104 and shielded from external air.

The insulating material constituting the insulating layer 104 is filled in the gap between the members of the lead frame. As a result, the lead frame 102 is embedded in the insulating layer 104 while one side thereof (the side on which the semiconductor chip is not mounted) is exposed.

The insulating layer 104 comprises an inorganic filler dispersed in a thermosetting resin composition. The thermal conductivity of insulating layer 104 is, for example, 1 to 10 W/(m·K), preferably 3 to 10 W/(m·K), and more preferably 5 to 10 W/(m·K). The coefficient of thermal expansion of the insulating layer 104 is, for example, 8 to $20 \times 10^{-6}$ $K^{-1}$, preferably 8 to $17 \times 10^{-6}$ $K^{-1}$, and more preferably 8 to $13 \times 10^{-6}$ $K^{-1}$. The modulus of elasticity is, for example, 20 to 50 MPa, preferably 20 to 40 MPa, and more preferably 20 to 30 MPa. These characteristics can be adjusted by modifying the compositions of the insulating layer 104.

Figure 2:
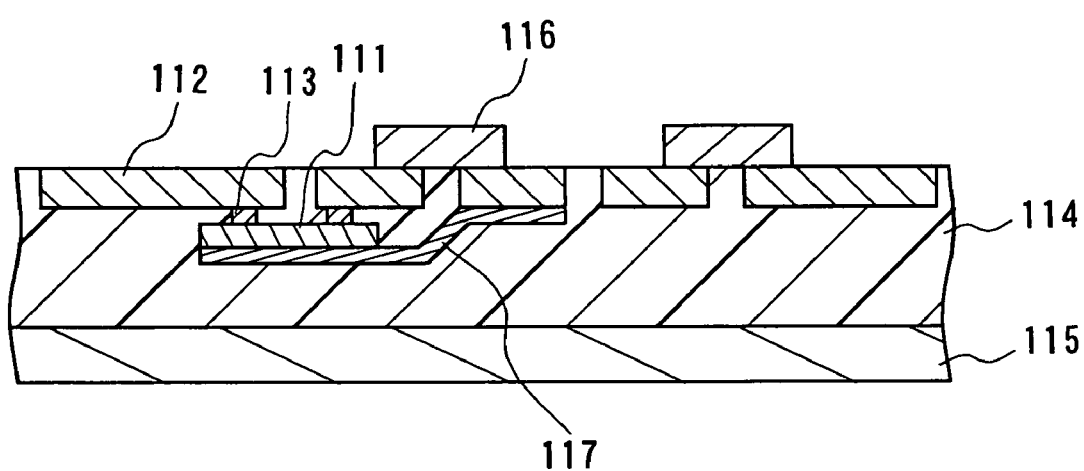
FIG. 2 is a cross-sectional view to show a second example of power modules of the present invention.

FIG. 2 is a cross-sectional view to show a second power module of the present invention. This power module comprises an insulating layer 114, a semiconductor chip 111 arranged in the insulating layer 114, a lead frame 112 formed on the first side of the insulating layer 114, and a heat sink 115 formed on the second side of the insulating layer 114. A surface mounted electronic component 116 is arranged on the first side of the insulating layer 114. The semiconductor chip 111 is configured to carry current in the thickness direction of the chip, and a surface electrode and a backside electrode are provided respectively on the face and back thereof. The semiconductor chip 111 is arranged with its face facing the lead frame 112 and its back facing the heat sink 115.

The surface electrode of the semiconductor chip 111 is connected with the lead frame 112 through the bump 113, i.e., the surface electrode is connected by flip-chip bonding. The backside electrode of the semiconductor chip 111 is connected with the lead frame 112 through an inner lead 117. This inner lead 117 is buried in the insulating layer 114.

The inner lead 117 can be made of, for example, copper, aluminum, nickel or iron. The inner lead 117 preferably has a plating layer of a metal such as nickel, tin, solder or gold, which is formed on the surface. The inner lead 117 has a thickness of, for example, 0.1 to 2.0 mm, preferably 0.4 to 1.0 mm, and more preferably, 0.5 to 0.8 mm.

The semiconductor chip 111 will be configured to carry current in the thickness direction to handle larger current, when it is used for power electronics. Therefore, the electrical resistance of the inner lead should be lowered as much as possible and the ohmic loss be minimized to derive current from the backside electrode. In general, a 0.2 mm thick inner lead can be used for current up to about 5 A, but the lead should have a thickness of 0.5 mm or more for a current of about 20 A, and a thickness of 0.8 mm or more for a current of about 40 A.

The power module shown in FIG. 2 is identical to the power module in FIG. 1 except that the backside electrode of the semiconductor chip is connected with the lead frame through the inner lead.

Figure 3:
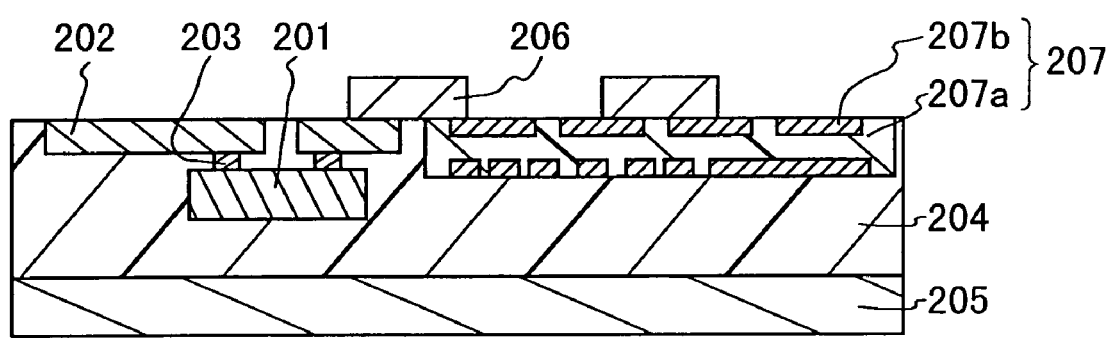
FIG. 3 is a cross-sectional view to show a third example of power modules of the present invention.

FIG. 3 is a cross-sectional view to show a third power module of the present invention. The power module shown in FIG. 3 comprises an insulating layer 204, a semiconductor chip 201 arranged in the insulating layer 204, a lead frame 202 formed on the first side of the insulating layer 204, and a heat sink 205 formed on the second side of the insulating layer 204. The power module further comprises a circuit board 207 embedded in the first side of the insulating layer 204. In FIG. 3, 203 denotes a bump and 206 denotes a surface mounted electronic component.

An insulating material constituting the insulating layer 204 is filled also in the gap between the lead frame 202 and the circuit board 207. Accordingly, the circuit board 207 is embedded in the insulating layer 204 with one of its sides being exposed.

The circuit board 207 is prepared by laminating conductive layers 207b constituting a wiring pattern and at least one insulating substrate 207a. The insulating substrate 207a is made of, for example, a glass-epoxy substrate prepared by impregnating a glass cloth with an epoxy resin, a paper-phenol substrate prepared by impregnating paper with a phenol resin, or the like. The conductive layers 207b can be made of, for example, copper, aluminum or the like. The circuit board 207 is not limited to a double-sided wiring board as shown in FIG. 3, but it can be a multilayered wiring board comprising more layers.

The power module shown in FIG. 3 is identical to the power module in FIG. 1 except that the circuit board 207 is provided.

A power module of the present invention can be manufactured, for example, in the following process. FIGS. 4A–4F show a process chart to exemplify a method of manufacturing a power module shown in FIG. 1.

First, a lead frame 302 is formed on the surface of a release carrier 301 (FIG. 4A).

The lead frame 302 can be made of a metal foil of, for example, copper, aluminum, nickel or iron. The surface of the lead frame 302 is preferably plated with metal such as nickel, tin, solder or gold to prevent oxidation.

It is further preferable that the surface of the lead frame 302 is roughened. Roughening can be carried out either chemically or physically. For chemical roughening, for example, the lead frame is dipped in an aqueous solution of iron chloride, copper chloride or the like for etching. For physical roughening, for example, powder of aluminum oxide or the like is blown on the surface of the lead frame with compressed air.

Roughening the surface of the lead frame can improve remarkably the bonding to the insulating layer, since the roughening increases the surface area and thus, the strength to bond is increased due to the anchoring effect. Since the bonding to the insulating layer is improved, reliability against heat shocks such as heat cycles is improved remarkably. To obtain such a physical anchoring effect efficiently, the above-mentioned method to blow a hard inorganic powder with compressed air is most effective. In roughening of such a lead frame, Rz is preferably from 2 μm to 20 μm and more preferably, from 2 to 5 μm, when Rz represents a degree of roughness. Rz is obtained from a difference between an average value of peaks from the highest to the fifth highest and an average value of valleys from the deepest to the fifth deepest in the profile of the roughened surface. A greater value indicates a rougher surface.

When the release carrier 301 is an organic film, the lead frame 302 can be formed in the following process. First an adhesive is applied on the release carrier. A metal foil is laminated on the adhesive-applied surface of the release carrier, and patterned by photolithography and etching. Preferably, the adhesive is a tacky one such as rubber-based adhesive.

When the release carrier 301 is a metal foil, the lead frame 302 can be formed in the above-mentioned process. Alternatively, a metal layer can be formed on a release carrier by electrolytic plating etc. so that this metal layer becomes a lead frame 302. In this method, no adhesive will remain after the release carrier is peeled off, and thus, a clean surface can be obtained. Moreover, peeling can be carried out in a simple manner.

Next, a semiconductor chip 303 is mounted at a certain position of the lead frame 302 (FIG. 4B). This step is carried out by flip-chip mounting, and more specifically, with the following steps. First, a bump 304 is formed on the surface of an electrode of the semiconductor chip 303, and solder is formed on the surface of the bump 304. Subsequently, this semiconductor chip 303 is borne face down on the lead frame 302. The solder is reflowed in order to join the bump 304 to the lead frame 302. Alternatively, the bump 304 is formed previously on the surface of the electrode of the semiconductor chip 303, and this semiconductor chip 303 is subjected to heat and pressure or ultrasonic waves while it is borne face down on the lead frame 302, so that the bump 304 and the lead frame 302 are directly bonded with each other.

Next, an insulating paste 305 is printed on the surface of the release carrier 301 on which the lead frame 302 is formed, so that an uncured insulating layer is formed (FIG. 4C). The insulating paste 305 is printed to cover the semiconductor chip 303.

The insulating paste 305 is prepared by mixing as required a solvent with an insulating material comprising an inorganic filler and a thermosetting resin composition.

The thermosetting resin composition comprises a thermosetting resin and appropriate additives such as a hardening agent and a hardening accelerator. The thermosetting resin can be, for example, an epoxy resin, a phenol resin or a cyanate resin. Among them, a thermosetting resin that is liquid at room temperature, for example, bisphenol A epoxy resin, bisphenol F epoxy resin or liquid phenol resin is preferably used alone or as a mixture with a thermosetting resin that is solid at room temperature.

The hardening agent and the hardening accelerator are selected corresponding to the types of the thermosetting resins. When an epoxy resin is used for the thermosetting resin, the hardening agent can be selected from, for example, amines such as aliphatic polyamine and aromatic polyamine, acid anhydrides, phenol resins such as novolac, and amino resins. In such a case, the hardening accelerator can be, for example, imidazoles and amines such as benzyl dimethylamine.

Preferable contents of the respective substances in the thermosetting resin composition are as follows. A thermosetting resin that is solid at room temperature is 0 to 45 wt %, a thermosetting resin that is liquid at room temperature is 5 to 50 wt %, and these thermosetting resins are 50 to 95 wt % in total, and preferably, 65 to 90 wt %. The hardening agent is 4.9 to 45 wt %, and preferably, 9.9 to 35 wt %. The hardening accelerator is 0.1 to 5 wt %, and preferably, 0.5 to 3.5 wt %.

For the inorganic filler, various oxides and nitrides can be used, such as, $Al_2O_3$, $SiO_2$, $MgO$, $BN$, and $AlN$. A preferable average particle diameter of the inorganic filler is 0.1 to 100 μm, and more preferably, 7 to 12 μm.

Preferable contents of the respective substances in the insulating material are as follows. The thermosetting resin composition is 5 to 30 wt %, preferably 7 to 15 wt %, and further preferably, 9 to 12 wt %. The inorganic filler is 70 to 95 wt %, preferably, 86 to 93 wt %, and further preferably, 89 to 93 wt %.

The insulating material preferably includes additives such as a coupling agent, a dispersant, a coloring agent, and a release agent as required. Accordingly, the characteristics of the insulating layer can be improved. For example, a coupling agent improves adhesiveness between the inorganic filler and the thermosetting resin, so it serves to improve the breakdown voltage. A dispersant improves dispersion of the inorganic filler, so it serves to decrease uneven dispersion of substances in the insulated layer. A coloring agent serves, for example, to improve heat dissipation of the insulating layer if it is a black agent such as carbon powder.

An insulating material prepared by kneading the above-identified thermosetting resin composition and the inorganic filler can be used as it is for the insulating paste 305 if it has an appropriate viscosity for application. When the insulating material has a rather high viscosity, the viscosity can be adjusted properly by mixing a solvent that will volatilize in a post-process. For this purpose, a solvent whose boiling point is lower than the curing point of the thermosetting resin can be used. The viscosity of the insulating paste 305 is not specifically limited but proper values are about 100 to 300 Pa·s.

The insulating paste 305 can be printed by, for example, metal mask printing or by screen printing. In case of the screen printing, printing should be repeated until a layer of desired thickness is obtained. Preferably, printing is carried out in a vacuum, or heat treatment is carried out in a vacuum after printing, in order to fill the insulating paste 305 in the gap between the lead frame 302 and the semiconductor chip 303 with certainty and to reduce voids in the insulating layer.

In the next step, a heat sink 306 is laminated on the insulating paste 305. Later, heat and pressure are applied to cure the thermosetting resin constituting the insulating paste 305 and to provide an insulating layer 307 (FIG. 4D). As a result, the insulating layer 307 is integrated with the semiconductor chip 303, the lead frame 302 and the heat sink 306.

For the heat sink 306, for example, an aluminum sheet, a copper sheet or the like can be used. A sheet having a heat dissipating fin is especially preferred. It is also preferable that the surface of the heat sink 306 is previously roughened in the same manner as the roughening treatment for the above-mentioned lead frame surface.

Effects that are obtainable by roughening a surface of the heat sink in contact with the insulating layer are similar to the effects obtainable by roughening the lead frame. The degree of the roughness is also similar to that of the lead frame.

The temperature for applying heat and pressure is not less than the curing point of the thermosetting resin constituting the insulating paste 305, or typically, 130 to 260° C., and preferably, 170 to 230° C. An appropriate pressure is usually not more than 19.6 MPa, and preferably, from 2.9 to 14.7 MPa.

Next, the release carrier 301 is peeled from the lead frame 302 and from the insulating layer 307 (FIG. 4E). At this time, the adhesive applied to the release carrier 301 is also removed with the release carrier 301 from the lead frame 302.

Subsequently, a surface mounted electronic component 308 is mounted at a desired portion of the lead frame 302 surface from which the release carrier 301 has been removed, and thus, a power module is produced (FIG. 4F).

The methods for mounting the surface mounted electronic component 308 are not specifically limited. In an example, solder is formed on the surface of an electrode of the surface mounted electronic component 308 and the solder is reflowed while the surface mounted electronic component 308 is borne on the lead frame 302. In this case, a leadless solder is preferably used since less cracks will occur in the soldered portions. Applicable solder forming methods include solder resist formation and solder paste printing.

For manufacturing a power module shown in FIG. 2 by the above-mentioned method, the surface electrode of the semiconductor chip and the lead frame are connected with each other through a metal bump before the backside electrode of the semiconductor chip and the lead frame are connected with each other through the inner lead in the step shown in FIG. 4B. This step is followed by the step shown in FIG. 4C.

For manufacturing a power module shown in FIG. 3 by the above-mentioned method, a circuit board is arranged on the adhesive-applied side of the release carrier not to overlap with the lead frame in the step of FIG. 4A, and the insulating paste is applied in the step of FIG. 4C to cover the circuit board also.

The printing step for forming an insulating layer and the step for curing the insulating layer are carried out separately in the above-mentioned process, but these steps also can be carried out continuously as a sequence of steps.

A power module of the present invention can be manufactured also using the following method. FIGS. 5A–5F are cross-sectional views to show the steps of the method of manufacturing a power module of the present invention.

Figure 5A:
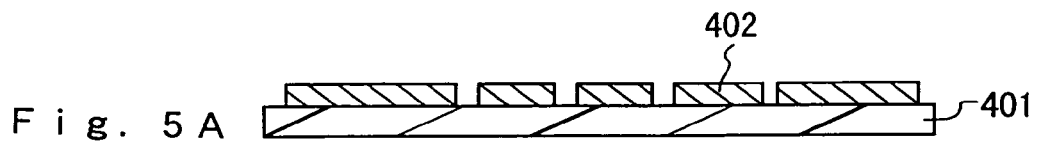
FIGS. 5A–5F are cross sectional views to show process steps to manufacture another power module of the present invention.
Figure 5B:
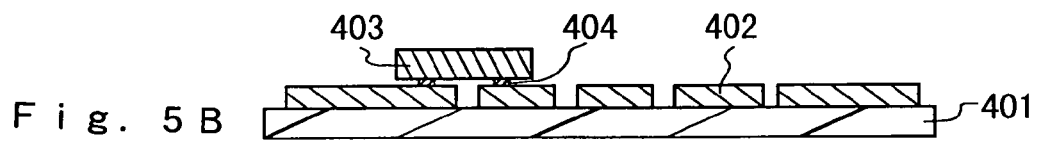

First, a lead frame 402 is formed on the surface of a release carrier 401 (FIG. 5A). Then, a semiconductor chip 403 is mounted at a certain position of the lead frame 402 (FIG. 5B). These steps can be carried out in the same manner as shown in FIGS. 4A–4B. Numeral 404 denotes a bump.

Figure 5C:
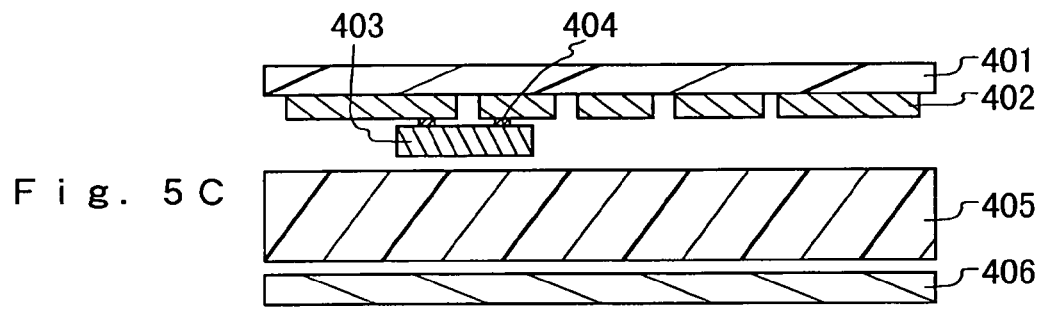

Next, an insulating sheet 405 is positioned and laminated on the lead frame 402 having the semiconductor chip 403 mounted thereon, so that an uncured insulating layer is formed (FIG. 5C).

The insulating sheet 405 is flexible in an uncured state. This insulating sheet 405 can be produced by the following process. First an appropriate solvent is mixed with an insulating material comprising an inorganic filler and a thermosetting resin composition, so that a slurry is prepared. The slurry is applied on the film surface and subsequently the solvent is dried. The method for applying the slurry is not specifically limited, but some other methods such as a doctor blade method, a coating method, and extrusion molding can be used. Though the slurry's viscosity is not specifically limited, but an appropriate value range is about 5–100 Pa·s for a doctor blade method. The drying temperature is determined to be equal to or higher than the boiling point of the solvent but not more than the curing point of the thermosetting resin, and typically, 70 to 100° C. The film used here is peeled from the insulating sheet 405 after drying the solvent.

The insulating material used here can be the same as that described in the explanation for FIG. 4C. Preferable solvents, such as methyl ethyl ketone, have boiling points of not more than 100° C. There is no need to add a solvent if the insulating material has a proper viscosity for forming the sheet and the sheet is flexible after the solvent is dried.

Figure 5D:
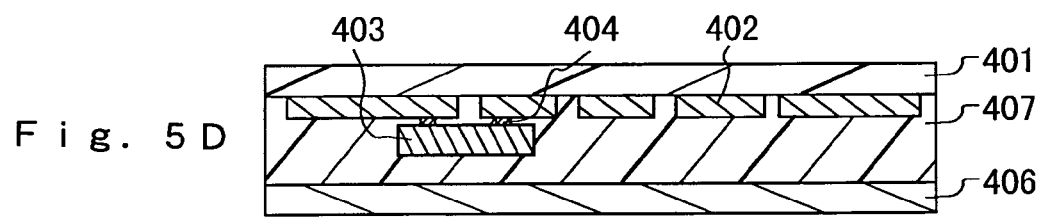
Figure 5E:
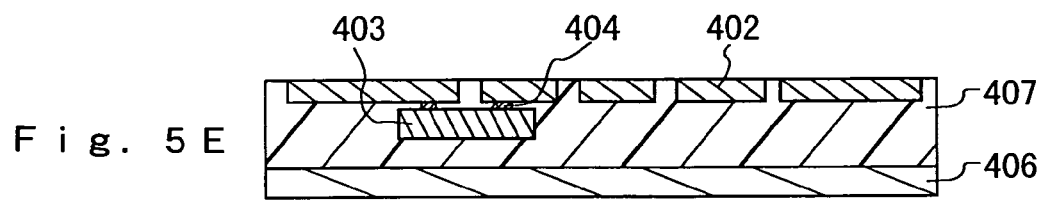

Next, a heat sink 406 is laminated on the insulating sheet 405 and subsequently, heat and pressure are applied to cure the thermosetting resin constituting the insulating sheet 405 and to make an insulating layer 407 (FIG. 5D). This step can be carried out in the same manner as the step of FIG. 4D. The pressure applied to the laminate is not more than 19.6 MPa, and more preferably, it is from 2.94 to 14.7 MPa. Accordingly, the insulating layer 407 is bonded to the semiconductor chip 403, the lead frame 402 and the heat sink 406 to be integrated.

Figure 5F:
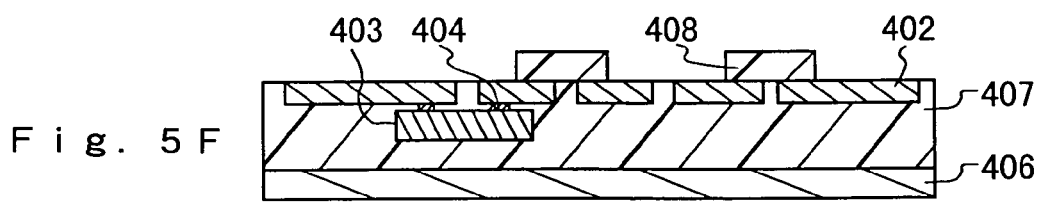

Subsequently, in the same manner as the step shown in FIG. 4F, the release carrier 401 is peeled (FIG. 5E), and the surface mounted electronic component 408 is mounted, so that a power module is produced (FIG. 5F).

When a power module as shown in FIG. 2 is manufactured with the above-mentioned process steps, the surface electrode of the semiconductor chip and the lead frame are connected with each other through a metal bump in the step of FIG. 5B before the backside electrode of the same semiconductor chip and the lead frame are connected with each other through the inner lead. This step is followed by the step shown in FIG. 5C.

When a power module as shown in FIG. 3 is manufactured with the above-mentioned process steps, a circuit board is arranged on the adhesive-applied surface of the release carrier not to overlap with the lead frame, and in the step of FIG. 5C, the insulating sheet will be laminated to cover also the circuit board.

First Embodiment

A power module configured as shown in FIG. 1 was produced in the following process steps. First, a polyphenylene sulphide (PPS) film 50 µm in thickness was prepared as a release carrier and a rubber-based adhesive was applied on the surface of the release carrier to be 10 µm in thickness. A copper foil 250 µm in thickness was bonded to the adhesive-applied surface of the release carrier by a roll-laminate method. After laminating a dry film on the copper foil surface, the dry film was exposed through a mask formed with a wiring pattern, and developed to remove the dry film in a portion other than the exposed portion. Next, unnecessary portions of the copper foil were removed by dipping in a solution of ferric chloride, and then, the dry film was further removed by using sodium hydroxide, so that a lead frame was formed.

Next, a semiconductor chip was flip-chip mounted on the lead frame. An IGBT for current of 50 A (manufactured by Matsushita Electronics Corporation) was used for the semiconductor chip. A bump 100 µm in diameter and 40 µm in height was formed at an electrode of the semiconductor chip by gold plating, and an eutectic solder was further printed on the bump. The semiconductor chip was arranged on a lead frame and the eutectic solder was melted by using a solder reflow apparatus, so that the electrode of the semiconductor chip and the lead frame were electrically connected with each other.

Next, an insulating layer was formed by printing an insulating paste on the release carrier having the lead frame and the semiconductor chip. The insulating paste used here was prepared by kneading a resin composition comprising the following substances by using a three-roller and adjusting the viscosity to be 100 Pa·s (25° C.).

(1) 90 wt % of $Al_2O_3$ (with a trade name of AS-40 manufactured by Showa Denko K.K, spherical particles, the average particle diameter of 12 µm)

(2) 9.5 wt % of an epoxy resin composition (with a trade name of WE-3025 manufactured by Nippon Pelnox Corporation, comprising 50 wt % of an epoxy resin, 45 wt % of a hardening agent (acid anhydride), and 5 wt % of a hardening accelerator (imidazole))

(3) 0.3 wt % of carbon black (manufactured by Toyo Carbon)

(4) 0.2 wt % of dispersant (with a trade name of "Prysurf F-208F" manufactured by Dai-ichi Kogyo Seiyaku Co., Ltd.)

In a printing process, a lead frame was set on a printing stage, a SUS metal mask (0.7 mm in thickness) having an aperture for the portion to be printed was positioned to overlap with the lead frame. An insulating paste was dropped on the metal mask and the aperture of the mask was filled with the insulating paste by using a SUS plate squeegee. After the metal mask was removed, heat treatment was carried out in a vacuum so that voids in the insulating layer were removed and the thermosetting resin constituting the insulating layer became untacky in an uncured state.

Next, an aluminum sheet 1.0 mm in thickness was laminated as a heat sink on the insulating layer and subjected to heat and pressure for 30 minutes under a condition of 175° C. and 4.9 MPa. As a result, the thermosetting resin in the insulating layer was cured, and at the same time, the insulating layer, the semiconductor chip, the lead frame and the heat sink were integrated. After the application of heat and pressure, the insulating layer was 0.63 mm in thickness. After that, the release carrier is peeled to obtain a power module.

In an evaluation of thermal conductivity of the obtained power module, the heat resistance was 0.8° C./W. The heat resistance was calculated by supplying current to the semiconductor chip and by measuring the temperature of the backside of the heat sink.

For evaluating the reliability, a reflow test was carried out for 10 seconds at a maximum temperature of 260° C. At this time, no abnormalities such as gaps were found in the interface between the insulating layer and the lead frame or between the insulating layer and the semiconductor chip, and thus, strong bonding was obtained.

Second Embodiment

Sheet-like insulators were produced by printing insulating pastes of the respective compositions shown in Table 1 on PPS films (75 μm in thickness), drying, and further by laminating second PPS films and curing by heat and pressure.

TABLE 1

| Sample No. | Inorganic fillers | | Thermosetting resin composition | | Coloring agent (wt %) | Dispersant (wt %) | Coupling agent (wt %) |
|---|---|---|---|---|---|---|---|
| | Type | Amount (wt %) | Type | Amount (wt %) | | | |
| 1 | Al$_2$O$_3$ | 65 | Epoxy resin | 34 | 0.5 | 0.3 | 0.2 |
| 2 | Al$_2$O$_3$ | 90 | Epoxy resin | 9 | 0.5 | 0.3 | 0.2 |
| 3 | SiO$_2$ | 70 | Epoxy resin | 29 | 0.5 | 0.3 | 0.2 |
| 4 | SiO$_2$ | 75 | Epoxy resin | 24 | 0.5 | 0.3 | 0.2 |
| 5 | SiO$_2$ | 80 | Epoxy resin | 19 | 0.5 | 0.3 | 0.2 |
| 6 | SiO$_2$ | 85 | Epoxy resin | 14 | 0.5 | 0.3 | 0.2 |
| 7 | MgO | 75 | Epoxy resin | 24 | 0.5 | 0.3 | 0.2 |
| 8 | MgO | 85 | Epoxy resin | 14 | 0.5 | 0.3 | 0.2 |
| 9 | BN | 75 | Epoxy resin | 24 | 0.5 | 0.3 | 0.2 |
| 10 | BN | 85 | Epoxy resin | 14 | 0.5 | 0.3 | 0.2 |

In this embodiment, an epoxy resin composition compring 90 wt % of bisphenol F epoxy resin (manufactured by Yuka Shell Epoxy Co., Ltd.), 3 wt % of an amine adduct ("MY-H" manufactured by Ajinomoto Co., Inc.) as a hardening agent, and 7 wt % of imidazole as a hardening accelerator was used.

The Al$_2$O$_3$ was "AS-40" (trade name) manufactured by Showa Denko K.K. The SiO$_2$, MgO and BN were chemical reagents manufactured by Kanto Chemical Co., Inc. The coloring agent was carbon black manufactured by Toyo Carbon and the dispersant was "Prysurf F-208F" (trade name) manufactured by Dai-ichi Kogyo Seiyaku Co., Ltd. The coupling agent was a titanate coupling agent "Plane Act" (trade name) manufactured by Ajinomoto Co., Inc.

Modulus of elasticity, coefficient of thermal expansion and thermal conductivity of the produced insulating sheets were measured.

Modulus of elasticity was measured according to the method described in JIS C 6481.

The coefficient of thermal expansion was obtained in the following manner. The temperature of each sample (5 mm×5 mm; 1.0 mm in thickness) was raised at a rate of 5° C./minute and the thermal expansion amount was measured in the thickness direction by using a thermal analyzer. This thermal expansion amount was converted to a value per 1° C., and represented as a rate to the sample's dimension at 0° C. The measurement was carried out at temperatures ranging from 40 to 100° C., and an average value was calculated in this range to obtain the coefficient.

Thermal conductivity was obtained in the following manner. The first side of a sample (5 mm×5 mm, 1.0 mm in thickness) was kept in contact with a heater, and the second side of the sample was fixed to a heat dissipating fin that is cooled to room temperature. The sample was heated with constant power in this state, and the difference in temperatures between the first side and the second side of the sample was measured to calculate a heat resistance value as a difference in temperature per electric power. The thermal conductivity was calculated from the inverse number of the heat resistance value.

Ten kinds of power modules were produced in the substantially same manner of First Embodiment except that the insulating pastes of the respective compositions shown in Table 1 were used. For each power module, a heat cycle test was carried out before measuring the breakdown voltage. The heat cycle test included 1000 repetitions of operations of retaining a power module under a low-temperature condition of −55° C. for 30 minutes and subsequently retaining the same module under a high-temperature condition of 125° C. for 30 minutes.

The measurement results are shown in Table 2.

TABLE 2

| Sample No. | Modulus of Elasticity (MPa) | Thermal expansion coefficient (×10$^{-6}$K$^{-1}$) | Thermal conductivity (W/mK) | Breakdown voltage (kV/mm) |
|---|---|---|---|---|
| 1 | 10.2 | 32.0 | 0.8 | 1.2 |
| 2 | 46.4 | 12.9 | 5.1 | >5.0 |
| 3 | 25.5 | 19.8 | 1.2 | >5.0 |
| 4 | 28.8 | 17.7 | 1.7 | >5.0 |
| 5 | 32.4 | 16.6 | 2.2 | >5.0 |
| 6 | 40.1 | 13.5 | 2.7 | >5.0 |
| 7 | 33.2 | 15.7 | 3.1 | >5.0 |
| 8 | 45.5 | 19.8 | 5.7 | >5.0 |
| 9 | 24.3 | 11.7 | 3.3 | >5.0 |
| 10 | 29.9 | 8.5 | 7.7 | >5.0 |

As shown in Table 2, when the samples include inorganic fillers of 70 to 95 wt % and thermosetting resin compositions of 5 to 30 wt % (samples Nos. 2 to 10), insulators with excellent thermal conductivity, high modulus of elasticity and coefficient of thermal expansion of the same level as a semiconductor, were obtained. A power module using such an insulating layer had high reliability in the heat cycle.

Third Embodiment

A power module configured as shown in FIG. 1 was produced in the following manner. First, a lead frame was formed on a release carrier, and a semiconductor chip was flip-chip mounted on the lead frame in the same manner of First Embodiment.

Next, a solvent of methyl ethyl ketone was added to a resin composition comprising the following substances before rotational mixing in a pot comprising an alumina ball for 48 hours at a speed of 500 rpm to prepare slurry. The amount of the methyl ethyl ketone solvent to be added was controlled to adjust the slurry's viscosity to be about 20 Pa·s.

(1) 85 wt % of AlN (manufactured by Dow Chemical Co. Ltd., the average particle diameter of 12 μm)

(2) 14 wt % of a cyanate resin composition (manufactured by Asahi Ciba with a trade name of "AroCy M-30")

(3) 0.3 wt % of carbon black (manufactured by Toyo Carbon)

(4) 0.2 wt % of a dispersant (manufactured by Dai-ichi Kogyo Seiyaku Co., Ltd. with a trade name of "Prysurf F-208F")

Next, the slurry was coated on a 75 μm thick polyethylene terephthalate(PET) film by a doctor blade method providing a gap (distance between the blade and the PET film) of about 1.4 mm. Next, the film sheet was left for one hour at a temperature of 100° C. to dry the methyl ethyl ketone solvent contained in the film sheet. Then the PET film was peeled to obtain a flexible insulating sheet (750 μm in thickness).

Subsequently, a lead frame with a mounted semiconductor chip, an insulating sheet and an aluminum sheet as a heat sink were laminated and subjected to heat of 260° C. and pressure of 9.8 MPa for one hour to cure the thermosetting resin in the insulating sheet and also to integrate the insulating layer, the semiconductor chip, the lead frame and the heat sink. Later the release carrier was peeled to obtain a power module.

In an evaluation of thermal conductivity of the obtained power module, the heat resistance value was 0.75° C./W. The measured breakdown voltage was 10 KV/mm or more.

Fourth Embodiment

A power module having the similar configuration of FIG. 2 was produced in the following manner. First, a copper foil 70 μm in thickness was prepared as a release carrier and a copper plating layer 250 μm in thickness was formed on the surface of the copper foil by electrolytic copper plating. After bonding a dry film to the surface of the copper plating layer on the release carrier, the dry film was exposed through a mask formed with a wiring pattern and developed to remove the dry film in a portion other than the exposed portion. Next, an unnecessary portion of the copper foil was removed by dipping in a solution of ferric chloride, and then, the dry film was further removed by using sodium hydroxide, so that a lead frame of a copper plating layer was formed on the metal carrier.

Next, a semiconductor chip was flip-chip mounted on the lead frame. An IGBT for current of 50 A manufactured by Matsushita Electronics Corporation was used for the semiconductor chip. A bump 100 μm in diameter and 40 μm in height was formed on a surface electrode of the semiconductor chip by gold plating, and an eutectic solder was printed on the bump. The semiconductor chip was arranged on the lead frame so that the surface electrode faces the lead frame. The eutectic solder was then melted by using a solder reflow apparatus while the semiconductor chip was fixed, so that the surface electrode of the semiconductor chip and the lead frame were electrically connected with each other.

Subsequently, a backside electrode of the same semiconductor chip and the lead frame were connected with each other through an inner lead. The inner lead was produced previously by stamping a copper sheet and forming a 1 μm thick gold plating layer on the surface. This inner lead was bonded to the backside electrode of the semiconductor chip and also to the lead frame by using an ultrasonic bonding apparatus.

Next, an insulating layer was formed by printing an insulating paste on the release carrier provided with the lead frame and the semiconductor chip. The insulating paste used here was substantially the same as the First Embodiment. Next, an aluminum sheet 1.0 mm in thickness was laminated as a heat sink on the insulating layer, subjected to heat and pressure for 30 minutes at 175° C. and 4.9 MPa for curing the thermosetting resin in the insulating layer and also for integrating the insulating layer, the semiconductor chip, the lead frame and the heat sink. Then the release carrier was peeled, so that a power module was obtained. In the obtained power module, the inner lead was buried in the insulating layer, and transformation due to curing of the insulating layer did not occur.

In an evaluation of thermal conductivity of the obtained power module, the heat resistance value was 0.75° C./W. For evaluating the reliability, a reflow test was carried out for ten seconds at a maximum temperature of 260° C. At this time, no abnormalities such as gaps were found in the interface between the insulating layer and the lead frame, between the insulating layer and the semiconductor chip, or between the insulating layer and the inner lead, and thus, strong bonding was obtained.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A power module comprising:
   an insulating layer comprising an inorganic filler and a thermosetting resin composition;
   a lead formed on one side of the insulating layer;
   a heat sink formed on another side of the insulating layer;
   at least one semiconductor chip sealed in the insulating layer and electrically connected with a buried side of the lead by flip-chip bonding;
   an electronic component that is not sealed within the insulating layer, and is electrically connected and mounted to an exposed side of the lead that is opposite to the buried side of the lead on which the at least one semiconductor chip is disposed; and
   at least one portion of the insulating layer is interposed between the semiconductor chip and the heat sink;
   wherein the semiconductor chip and the heat sink are electrically insulated from each other;
   the at least one semiconductor chip is disposed between the heat sink and the lead; and
   the lead is buried in the insulating layer while a part thereof is exposed at the surface of the insulating layer.

2. The power module according to claim 1, wherein the semiconductor chip has a first electrode facing the lead and a second electrode facing the heat sink, and the first electrode is electrically connected with the lead by flip-chip bonding while the second electrode is electrically connected with the lead through an inner lead arranged in the insulating layer.

3. The power module according to claim 1, wherein the proportion of the inorganic filler in the insulating layer is 70 to 95 wt % and the thermosetting resin composition is 5 to 30 wt %.

4. The power module according to claim 1, wherein the insulating layer has a thermal conductivity of 1 to 10 W/(m·K).

5. The power module according to claim 1, wherein the insulating layer has a coefficient of thermal expansion of 8 to $20 \times 10^{-6}$ $K^{-1}$.

6. The power module according to claim 1, wherein the insulating layer has a modulus of elasticity of 20 to 50 MPa.

7. The power module according to claim 1, further comprising a circuit board as a laminate of at least one substrate layer and wiring layers buried in the insulating layer while at least one of the wiring layers is exposed to the surface of the insulating layer.

8. The power module according to claim 1, wherein the thermosetting resin composition comprises a thermosetting resin, a hardening agent, and a hardening accelerator.

9. The power module according to claim 8, wherein the proportion of the thermosetting resin in the thermosetting resin composition is 50 to 95 wt %, the hardening agent is 4.9 to 45 wt %, and the hardening accelerator is 0.1 to 5 wt %.

10. The power module according to claim 1, wherein the thermosetting resin composition comprises at least one thermosetting resin selected from the group consisting of an epoxy resin, a phenol resin, and a cyanate resin.

11. The power module according to claim 1, wherein the thermosetting resin composition comprises an epoxy resin, a novolac resin, and imidazole.

12. The power module according to claim 11, wherein the proportion of the epoxy resin in the thermosetting resin composition is 60 to 80 wt %, the novolac resin is 18 to 39.9 wt %, and the imidazole is 0.1 to 2 wt %.

13. The power module according to claim 1, wherein the inorganic filler is at least one selected from the group consisting of $Al_2O_3$, $SiO_2$, MgO, BN and AlN.

14. The power module according to claim 1, wherein the inorganic filler has an average particle diameter of from 0.1 to 100 μm.

15. The power module according to claim 1, wherein the lead is made of at least one metal selected from the group consisting of copper, aluminum, nickel and iron.

16. The power module according to claim 1, wherein the lead is 0.05 to 1.00 mm in thickness.

17. The power module according to claim 1, wherein a plating layer of at least one metal selected from the group consisting of nickel, tin, solder and gold is formed on the surface of the lead being in contact with the insulating layer.

18. The power module according to claim 1, wherein the surface of the lead in contact with the insulating layer is roughened.

19. The power module according to claim 1, wherein the heat sink is made of either aluminum or copper.

20. The power module according to claim 1, wherein the heat sink comprises a heat dissipating fin.

21. The power module according to claim 1, wherein the surface of the heat sink in contact with the insulating layer is roughened.

* * * * *